United States Patent
Sugiyama et al.

(10) Patent No.: US 6,506,541 B2
(45) Date of Patent: Jan. 14, 2003

(54) PHOTO-CURABLE POLYMER COMPOSITION AND FLEXOGRAPHIC PRINTING PLATES CONTAINING THE SAME

(75) Inventors: Shingo Sugiyama, Ryugasaki (JP); Nobuyuki Tsukakoshi, Yokohama (JP); Larry McArthur Kegley, League City, TX (US); Xavier Muyldermans, Louvain-la-Neuve (BE)

(73) Assignee: Kraton Polymers US LLC, Houston, TX (US)

( * ) Notice: Subject to any disclaimer, the term of this patent is extended or adjusted under 35 U.S.C. 154(b) by 0 days.

(21) Appl. No.: 09/850,649

(22) Filed: May 7, 2001

(65) Prior Publication Data

US 2002/0045129 A1 Apr. 18, 2002

Related U.S. Application Data

(63) Continuation of application No. 09/339,607, filed on Jun. 24, 1999.
(60) Provisional application No. 60/091,145, filed on Jun. 29, 1998.

(51) Int. Cl.[7] .............................. G03C 1/73; G03C 1/76; G03F 7/028; G03F 7/038; G03F 7/09
(52) U.S. Cl. ............................ 430/287.1; 430/280.1; 430/281.1; 430/285.1; 430/273.1; 430/306; 430/905; 430/907; 430/916
(58) Field of Search ................... 430/287.1, 280.1, 430/281.1, 285.1, 916, 273.1, 306, 905, 907

(56) References Cited

U.S. PATENT DOCUMENTS

| | | | |
|---|---|---|---|
| 3,149,182 A | 9/1964 | Porter | 260/879 |
| 3,231,635 A | 1/1966 | Holden et al. | 260/880 |
| 3,238,173 A | 3/1966 | Bailey et al. | 260/29.7 |
| 3,239,478 A | 3/1966 | Harlan, Jr. | 260/27 |
| 3,265,765 A | 8/1966 | Holden et al. | 260/876 |
| 3,431,323 A | 3/1969 | Jones | 260/880 |
| 4,234,676 A | 11/1980 | Hein et al. | 430/286 |
| 4,323,636 A | 4/1982 | Chen | 430/271 |
| 4,460,675 A | 7/1984 | Gruetzmacher et al. | 430/300 |
| 4,726,877 A | 2/1988 | Fryd et al. | 156/630 |
| 4,753,865 A | 6/1988 | Fryd et al. | 430/281 |
| 4,894,315 A | 1/1990 | Feinberg et al. | 430/281 |
| 5,001,181 A * | 3/1991 | Takagi et al. | 524/401 |
| 5,081,193 A * | 1/1992 | Mishima et al. | 525/316 |
| 5,250,389 A | 10/1993 | Nakamura et al. | 430/281 |
| 5,496,684 A | 3/1996 | Farber et al. | 430/306 |
| 5,496,685 A | 3/1996 | Farber et al. | 430/306 |

FOREIGN PATENT DOCUMENTS

| | | | |
|---|---|---|---|
| EP | 0 456 336 | 4/1991 | G03F/7/033 |
| EP | 0 474 178 | 9/1991 | G03F/7/033 |
| EP | 0 513 493 | 3/1992 | G03F/7/031 |
| EP | 0 691 991 | 3/1994 | C08F/297/04 |
| EP | 0 699 961 | 3/1994 | G03F/7/027 |
| EP | 0 696 761 | 8/1995 | G03F/7/038 |
| EP | 0 740 214 | 4/1996 | G03F/7/033 |

* cited by examiner

Primary Examiner—Janet Baxter
Assistant Examiner—Sin J. Lee

(57) ABSTRACT

The present invention relates to a photo-curable polymer composition comprising: a) a first block copolymer comprising at least two blocks A of polymerised mono-vinyl aromatic monomer, and at least one block B of polymerised conjugated diene monomer, wherein the total polymerised mono-vinyl aromatic monomer content is in the range from 5 to 25% by weight of the block copolymer; b) 5 to 10% by weight of a second block copolymer having one block A of polymerised mono-vinyl aromatic monomer and at least one block B of polymerised conjugated diene monomer, wherein the total polymerised mono-vinyl aromatic monomer content is in the range from 5 to 50% by weight of the block copolymer, alkoxy or epoxy functional groups; and c) at least 5% by weight of a low molecular weight block copolymer, wherein the total of (b) and (c) is from 15% by weight to 80% by weight, the low molecular weight block copolymer having one block A of polymerised mono-vinyl aromatic monomer, and at least one block B of polymerised conjugated diene monomer, and having a weight average molecular weight in the range of from 1,000 to 35,000.

15 Claims, No Drawings

PHOTO-CURABLE POLYMER COMPOSITION AND FLEXOGRAPHIC PRINTING PLATES CONTAINING THE SAME

This is a continuation of copending application Ser. No. 09/339,607 filed on Jun. 24, 1999, which claims priority to U.S. patent application Ser. No. 60/091,145 filed on Jun. 29, 1998.

FIELD OF THE INVENTION

The present invention relates to photo-curable polymer compositions. In particular, it relates to photo-curable polymer compositions for use in printing plates, comprising a block copolymer having two or more polymerised monovinyl aromatic monomer blocks and one or more polymerised conjugated diene blocks; a second polymer having one polymerised monovinyl aromatic monomer block and one or more polymerised conjugated diene blocks, a low molecular weight block copolymer comprising one polymerised monovinyl aromatic monomer block and one or more polymerised conjugated diene blocks, and a photo-initiator. The invention further relates to flexographic printing plate precursors containing the photo-curable polymer composition, as well as to flexographic printing plates.

BACKGROUND OF THE INVENTION

Flexographic printing plates are well known in the art and are especially useful for commercial printing on diverse products such as flexible plastic containers, cartons, plastic bags, boxes and envelopes. For the purpose of this specification, uncured plates to be used for preparing (cured) flexographic printing plates are referred to as flexographic printing plate precursors. The flexographic printing plate precursors typically comprise a photo-curable layer prepared from a photo-curable polymer composition, and protective layer(s) to protect the photo-curable layer from daylight. Optionally, the flexographic printing plate precursor further comprises a support. A support is often used to give strength to the flexographic printing plate (precursor).

Alternatively, the side of the flexographic printing plate precursor opposite the image (printing) side of the printing plate is cured to form a support. Typically, in the absence of a support, a flexographic printing plate is prepared by first curing the side of the photo-curable layer of the FPP precursor removed from the printing side. As a result that aide of the photo-curable layer cross-links, becomes a thermoset substantially insoluble layer and acts as a support for the uncured part of the flexographic printing plate precursor. Subsequently, the side to be used for printing is selectively cured by exposing the photo-curable layer image-wise to light, e.g. UV light. The unexposed (uncured) parts of the layer are then removed in developer baths, e.g., with a solvent or water. After drying, the flexographic printing plate is ready far use.

It will be appreciated that the image-wise curing of the FPP precursor must be done in a precise manner. Any unintentional curing may load to an unclear image on the flexographic printing plate, and, hence unclear prints. In order to avoid undesired scattering of light it is important that the flexographic printing plate precursor is as transparent as possible, that is, not hazy. Moreover, there is a need for further improvement of the total combination of physical properties of such photo-curable polymer composition for use in a flexographic printing plate (precursor).

Printing plates must be soft and elastic after curing. Normally, elasticity is obtained by the presence of an elastomer in the photo-curable polymer composition. Often, the elastomer is a block copolymer having two or mare polymerised styrene and one or more polymerised diene blocks.

The FPP precursor must be easy and quick to cure, and the uncured material must be easy to remove, and is preferably not tacky. The flexographic printing plate must be dimensionally stable during storage; must be flexible enough to wrap around a printing cylinder; strong enough to withstand the rigors experienced during a printing process; abrasion resistant; soft enough to facilitate ink transfer during the printing process; and resistant enough to the particular ink solvent to avoid blurring of the image. It will be appreciated that the achievement of an attractive balance of all these physical properties will be difficult.

It would be desirable if a photo-curable polymer composition could be found that has a good abrasion resistance when cured, has a relatively low hardness, allows easy removal of uncured parts and/or is not hazy, thus allowing precise curing without scattering of actinic radiation to unwanted parts. Preferably, the photo-curable polymer composition has an attractive balance of the above and other relevant properties.

SUMMARY OF THE INVENTION

Such photo-curable polymer composition has now surprisingly been found. Accordingly, the present invention relates to a photo-curable polymer composition comprising:

(a) a first block copolymer comprising at least two external blocks A of polymerised mono-vinyl aromatic monomer, at least one internal block B of polymerised conjugated diene monomer, and, optionally, a residue of a di- or multi-functional coupling agent, wherein the total polymerised mono-vinyl aromatic monomer content is in the range from 5 to 25% by weight (% wt) of the block copolymer, and wherein the residue, if present, is derived from a di- or multi-functional coupling agent containing alkoxy or epoxy functional groups;

(b) 0 to 70% by weight, basis the total block copolymer composition (a)+(b)+(c), of a second block copolymer, the second block copolymer having one block A of polymerised mono-vinyl aromatic monomer, at least one block B of polymerised conjugated diene monomer, and, optionally, a residua of a di- or multi-functional coupling agent, wherein the total polymerised mono-vinyl aromatic monomer content is in the rangy from 5 to 50% by weight of the block copolymer, and wherein the residue, if present, is derived from a di- or multi-functional coupling agent containing alkoxy or epoxy functional groups;

(c) at least 5% by weight, basis the total block copolymer composition (a)+(b)+(c), of a low molecular weight block copolymer, wherein the total of (b) and (c) is from 15% by weight to 80% by weight, basis the total block copolymer composition (a)+(b)+(c), the low molecular weight block copolymer having one block A of polymerised mono-vinyl aromatic monomer, and at least one block H of polymerised conjugated diene monomer, and having a weight average molecular weight in the range of from 1,000 to 35,000; and (d) a photo-initiator.

For the purposes of this specification, the total block copolymer composition is taken to be block copolymers (a), (c), and, if present, (b). Typically, and preferably, the photo-curable polymer composition further comprises an ethylenically unsaturated addition-polymerisable cross-linking agent.

DETAILED DESCRIPTION OF THE INVENTION

The cross-linking agent is typically a component, such as a monomer or a mixture of monomers, that is compatible with the block copolymer(s). Monomers that can be used in the photo-curable polymer composition are well known in the art. Examples of such monomers can be found in U.S. Pat. Nos. 4,323,636; 4,753,865; 4,726,877 and 4,994,315.

The term "compatible" means that the captioned component can be mixed in a molecular-disperse fashion in the photo-curable composition or that the component has the same breaking index, does not substantially cause haze and does not separate from the photo-curable composition in the course of time, that is, does not separate within 14 days, preferably not within one month.

Typically, the ethylenically unsaturated addition-polymerisable cross-linking agent has a boiling point of at feast 100° C. at atmospheric pressure and a molecular weight of up to 3000, preferably up to 2000. Examples of suitable ethylenically unsaturated addition-polymerisable cross-linking agents include esters of acrylic acid or methacrylic acid, styrene and derivatives thereof, esters of maleic acid or fumaric acid, acrylamide or methacrylamide and allyl compounds. Preferably, esters of acrylic acid or methacrylic acid are used: Especially preferred monomers are 1,6-hexanediol diacrylate, 1,6-hexanediol dimethacrylate, and hydroxyethyl methacrylate.

Preferably, the first block copolymer is linear, and, if a coupling agent is used, the said coupling agent is di-functional. More preferably, no coupling agent is used. Most preferably, the first block copolymer has the structure A-B-A.

The total weight average molecular weight of the first block copolymer is preferably in the range of from 50,000 to 300,000 g/mol. More preferably, the weight average molecular weight is in the range from 65,000 to 250,000.

The weight average molecular weight can be determined with gel permeation chromatography (GPC) using polystyrene calibration standards (according to ASTM D 3536). From the measured apparent molecular weight (sometimes referred to as peak molecular weight) the (true) weight average molecular weight can be calculated. The apparent molecular weight is the molecular weight as if the polymer is 100% polystyrene as polystyrene calibration standards are used. The weight average molecular weight is a "true" molecular weight which takes the chemical composition of the polymer into account.

The total poly(mono-vinyl aromatic) content of the first block copolymer is preferably in the range from 10 to 22% by weight, more preferably 15 to 20% by weight.

The second block copolymer preferably has the structure A-B. The total weight average molecular weight of the second block copolymer is preferably in the range of mare than 35,000 to 150,000. More preferably, the weight average molecular weight is in the range from 40,000 to 150,000, even more preferably in the range from 45,000 to 120,000.

The total poly(mono-vinyl aromatic) content of the second block copolymer is preferably in the range from 5 to 25% by weight, more preferably 10 to 22% by weight, even more preferably 15 to 20% by weight.

The mono-vinyl aromatic monomer is typically selected from styrene, $C_1$–$C_4$ alkylstyrene and $C_1$–$C_4$ dialkylstyrene, in particular styrene, α-methylstyrene, o-methylstyrene or p-methylstyrene, 1,3-dimethylstyrene, p-tert.-butylstyrene or mixtures thereof, most preferably styrene,.

The conjugated diene monomer is typically a conjugated diene monomer containing from 4 to 8 carbon atoms, such as 1,3-butadiene, 2-methyl-1,3-butadiene (isoprene), 2,3-dimethyl-1,3-butadiene, preferably butadiene or isoprene or mixtures thereof, most preferably isoprene.

If 1,3-butadiene is used as the conjugated diene monomer, it may be preferred that a substantial part of the 1,3-butadiene is polymerised via 1,2 addition rather than via 1,4 addition. That is, according to one embodiment the 1,2 vinyl content of the butadiene block is preferably at least 25% by weight, more preferably from 30 to 60% by weight.

Block copolymers are typically prepared by anionic polymerisation. The preparation of block copolymers is well known to those skilled in the art and has been described in e.g. U.S. Pat. Nos. 3,265,765; 3,231,635; 3,149,182; 3,238, 173; 3,239,478; 3,431,323; Re. 27,145, and many handbooks including "Thermoplastic Elastomers, a comprehensive review" (1987), edited by N. R. Legge, (G. Holden, H. E. Schroeder, Hanser publishers.

The block copolymer composition comprising both first block copolymer (a) and second block copolymer (b) optionally to be used in the photo-curable composition of the present invention can suitably be prepared by three different methods.

(a) Polymerisation of a block of mono vinyl aromatic monomer with a monofunctional initiator, such as sec-butyl lithium or tert-butyl lithium; adding a conjugated diene to form a "living" diblock copolymer and coupling these living diblock copolymers with a di- or multi-functional (preferably di-functional) coupling agent captaining alkoxy or epoxy groups, preferably methoxy or ethoxy groups.

The coupling efficiency of such coupling agents is not 100% and the desired coupling efficiency can be tuned to some extent. Accordingly, the product is typically a mixture of coupled multiblock copolymer and uncoupled diblock copolymer.

(b) Sequential synthesis of a linear triblock copolymer using a monofunctional or difunctional initiator; separate polymerisation of a diblock copolymer and physical blending of the two block copolymers.

(c) The process disclosed in European patent specification No. 691991, which is incorporated herein by reference. The process involves (1) polymerising mono-vinyl aromatic monomer in an inert hydrocarbon solvent in the presence of an organolithium initiator until substantially complete conversion; (2) adding conjugated diene monomer to the polymerisation mixture and allowing said conjugated diene monomer to polymerise until substantially complete conversion; (3) adding a second portion of organolithium initiator, followed by the addition of a second portion of conjugated diene monomer to polymerise until substantially complete conversion; (4) adding a second portion of mono-vinyl aromatic monomer and allowing said mono-vinyl aromatic monomer to polymerise until substantially complete conversion; and (5) adding a terminating agent.

With "substantially complete conversion" is meant that the polymerisation is allowed to proceed until at least 90%, preferably at least 95%, more preferably at least 98% of the charged monomer has been polymerised.

In the above methods terminating agents are used to terminate any "living" polymer following polymerisation and any coupling with a suitable coupling agent. The terminating agent is a proton-donating compound, preferably an alkanol, more preferably a $C_1$–$C_4$ alkanol, in particular methanol.

Method (c) is preferred for the purposes of preparing the block copolymer composition comprising first and second block copolymers.

If the block copolymer composition to be used in the composition of the present invention contains a first block copolymer but not a second block copolymer, then the first block copolymer is typically linear and prepared by full sequential polymerisation.

The low molecular weight block copolymer is typically prepared separately by anionic polymerisation and blended with the fires block copolymer or the first and second block copolymer. The weight average molecular weight of the low molecular weight block copolymer is preferably from 5,000 to 32,000, more preferably from 10,000 to 30,000. The total poly (mono-vinyl aromatic) content of the low molecular weight block copolymer is preferably in the range from 5 to 25% by weight, more preferably from 10 to 22% by weight, even more preferably 12 to 20% by weight.

The amount of low molecular weight block copolymer is preferably not more than 55% by weight, more preferably not more than 50% by weight of the total block copolymer composition. If a second block copolymer is present, the amount of low molecular weight block copolymer is preferably at least 10% by weight, more preferably at least 15% by weight of the total block copolymer composition. If a second block copolymer is not present, the amount of low molecular weight block copolymer is preferably at least 20% by weight of the total block copolymer composition.

The second block copolymer, if present, typically comprises at least 5% by weight of the total block copolymer composition, preferably at least 10% by weight. Preferably, the second block copolymer comprises at most 60% by weight of the total block copolymer composition, more preferably at most 50% by weight, most preferably at most 40% by weight.

Photo-initiators are known to those skilled in the art and examples of suitable photo-initiators have been disclosed in European patent specification No. 0 696 761 and U.S. Pat. Nos. 4,894,315; 4,460,6.75 and 4,234,676, which are herein incorporated by reference. Typically, the photo-initiator is selected from optionally substituted polynuclear quinones, aromatic ketones, benzoin and benzoin ethers and 2,4,5-triarylimidazolyl dieters.

Preferred photo-initiators are Selected from the group consisting of:

(1) a benzophenone of the general formula (I)

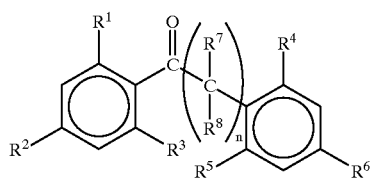

(I)

wherein $R^1$ to $R^6$ independently represent hydrogen or an alkyl group having from 1 to 4 carbon atoms, preferably methyl, and wherein $R^7$ and/or $R^8$ have the same meaning as $R^1$ to $R^6$ or represent is addition alkoxy or 1 to 4 carbon atoms and wherein n has a value of 0, 1, or 2, optionally in combination with at least one tertiary amine,

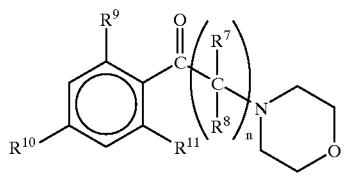

(II)

(2) a sulphur-containing carbonyl compound, wherein the carbonyl group is directly bound to at least one aromatic ring and is preferably of the general formula II wherein $R^9$, $R^{10}$, and $R^{11}$ each may represent hydrogen, alkyl of 1 to 4 carbon atoms, or an alkylthio having 1 to 4 carbon atoms, and (3) mixtures of (1) and (2).

Examples of suitable compounds of category (1) are benzophenone, 2,4,6-trimethylbenzophenone, 4-methylbenzophenone, and eutectic mixtures of 2,4,6-trimethylbenzophenone and 4-methylbenzophenone (ESACURE TZT), or 2,2-dimethoxy-1,2-diphenylethan-1-one (IRGACURE 651) (ESACURE and IRGACURE are trademarks). These compounds may be employed in combination with tertiary amines, such as e.g. UVECRYL 7100 (UVECRYL is a trademark). Category (2) embraces compounds such as, e.g., 2-methyl-1-[4-(methylthio)phenyl]-2-moxpholinopropanone-1, commercially available as IRGACURE 907. An example of suitable mixtures (category (3)) is a mixture of 15 percent by weight of a mixture of 2-isopropylthioxanthone and 4-isopropylthioxanthone, and 85 percent by weight of a mixture of 2,4,6-trimethylbenzophenone and 4-methylbenzophenone. This mixture is commercially available under the trade name ESACURE X15. Photo-initiators of any one of the above categories (1), (2), and (3) may also be used in combination with other photo-initiators, such as e.g. UVECRYL P115 to diamine). Particularly useful is a combination of benzophenone or IRGACURE 651 and said UVECRYL P115.

In a more preferred embodiment of the present invention the photo-initiator is selected from the group consisting of (1) benzophenone, or 2,2-dimethoxy-1,2-diphenylethan-1-one (IRGACURE 651), (ii) a mixture of benzophenone or IRGACURE 651, and a tertiary amine, and (iii) 2-methyl-1-[4-(methylthio)phenyl]-2-morpholino)propanone-1. Of these 2-methyl-1-[4-(methylthio)phenyl]-2-morpholinopropanone-1 or 2,2-dimethoxy-1,2-diphenyl-ethan-1-one are most preferred.

Preferably, the photo-curable polymer composition comprises 0.01 to 5% by weight of photo-initiator, basis the total composition, preferably 0.1 to 2.5% by weight.

The amount of ethylenically unsaturated addition-polymerisable cross-linking agent is preferably 0 to 40% by weight, basis the total composition, more preferably 1 to 40% by weight, in particular 5 to 35% by weight.

The photocurable composition may further comprise plasticisers, and/or one or more stabilisers such as antioxidants, UV stabilisers and radical scavenger, as well as any other additives known to those skilled in the art to be desirable in photo-curable compositions.

Plasticisers are well known to those skilled in the art. Typically, the hardness of a printing plate is decreased by adding a plasticiser to the photocurable polymer composition. The placticiser should be substantially compatible with at least the diene blocks of the elastomer.

Examples of plasticisers commonly used include oil and liquid polyolefins such as polyisoprene. Examples of alternative plasticisers which may be used in the composition of the invention are, oligomers of randomly polymerised styrene and conjugated diene, polybutylene, polybutadiene, polybutene-1, and ethylene-propylene-diene rubber, all having a weight average molecular weight in the range from 300 to 35,000, preferably from 300 to 25,000, more preferably from 500 to 10,000.

The plasticiser, if present, typically comprises up to 40% by weight of the total photo-curable composition, preferably, if present, at least 5% by weight to 35% by weight.

It has been found that the low molecular weight block copolymer (c) in the photo-curable composition of the present invention acts like a plasticiser in the sense that it decreases the hardness. Therefore, according to one preferred embodiment, the photo-curable composition of the invention does not contain plasticiser.

For the purposes of this specification, the low molecular weight block copolymer (c) is not included in the term plasticiser.

Stabilisers such as antioxidants/UV stabilisers/radical scavengers are also well known to those skilled in the art.

Especially hindered phenols, organo-metallic compounds, aromatic amines, aromatic phosphites and sulphur compounds are useful for this purpose. Preferred stabilisers include phenolic antioxidants, thio compounds and tris (alkyl-phenyl) phosphites.

Examples of commercially available antioxidants/radical scavengers are pentaerythrityl-tetrakis(3,5-di-tert-butyl-4-hydroxy-hydrocinnamate) (IRGANOX 1010); octadecyl ester of 3,5-bis (1,1-di-methylethyl-4-hydroxy benzene propanoic acid (IRGANOX 1076); 2,4-bis (n-octylthio)-6-(4-hydroxy-3,5-di-tert-butylanilino)-1,3,5-triazine (IRGANOX 565); 2-tert-butyl-6-(3-tart-butyl-2'-hydroxy-5-methylbenzyl)-4-methylphenyl acrylate (SUMILIZER GM); tris (nonylphenyl)phosphite; tris (mixed mono- and di-phenyl)-phosphite; bis (2,4-di-tert-butylphenyl)-pentaerythritol diphosphite (ULTRANOX 626); distearyl pentaerythritol diphosphite (WESTON 618); styrenated diphenylamine (NAUGARD 445); N-1,3-dimethyibutyl-N'-phenyl-paraphenylenediamine (SUMILIZER 116 PPD); tris (2,4-di-tert-butylphenyl)phosphite (IRGAFOS 168); 4,4-butylidene-bis-(3-methyl-6-tert-butylphenol) (IRGANOX, SUMILIZER, ULTRANOX, WESTON, NAUGARD and IRGAFOS are trademarks).

The stabiliser(s) is (are) typically present in the photo-curable composition in a total amount from 0.01 to 5% by weight, basis the total photo-curable composition, preferably 0.2 to 3% by weight.

Other well known components that may be present include polymerisation inhibitors, antiozonants, colorants, fillers or reinforcing agents. It belongs to the skill of the skilled person to select the appropriate additional components in the appropriate amounts.

According to a further aspect, the invention relates to a flexographic printing plate precursor comprising a photo-curable layer sandwiched between two release films or a release film and a support, wherein the release film(s) and any support substantially prevent actinic radiation to reach the photo-curable layer, and wherein the photo-curable layer contains the photo-curable polymer composition as described herein.

According to yet another aspect, the invention relates to a cured polymer composition, obtainable by curing a photo-curable composition as described herein with actinic radiation.

Curing is typically carried out by subjecting the photo-curable composition to actinic radiation. Usually, the photo-initiator used is most sensitive in the ultraviolet range. Therefore, preferably, the radiation source should furnish an effective amount of this radiation, more preferably having an output spectrum in the range from 200 to 500 nm, even more preferably in the range from 230 to 450 nm. Particularly suitable UV sources are FUSION bulb lamps having output maxima at 260–270 nm, 330 nm and 364 nm ("H" bulb), at 350–390 nm ("D" bulb) or at 400–430 nm ("V" bulb) (FUSION is a trademark). Combinations of these FUSION bulb lamps may also be used. H and D bulb lamps are particularly useful, while a combination of D bulb and H bulb can also be suitably applied.

A further example of a suitable source of UV radiation is a mercury-vapour lamp such as a 300 W/inch (300 W/2.5 cm) UV mercury medium pressure lamp from American UV Company.

The invention further relates to a flexographic printing plate containing the cured polymer composition as described herein.

Uncured portions of the flexographic printing place are typically removed with a solvent, followed by drying of the plates, according to procedures known to those skilled in the art as e.g, described in BP-A- 474 178.

Primarily for environmental reasons, uncured portions of the flexographic printing plate may also be removed by water. Water, however, is a bad solvent for the (hydrophobic) block copolymer composition as described herein. Therefore, typically hydrophilic polymers are added to the photo-curable composition, the said polymers having an acid or amine value of 2 to 200, preferably 5 to 120, more preferably 20 to 80, as described in EP-A-0 513 493.

Most flexographic printing plates are uniformly post-exposed to ensure that the photocross-linking process is complete, and optionally subjected to a detackification treatment according to procedures known to those skilled in the art as e.g. described in BP-A-0 474 178.

In addition, the invention relates to a process for printing on a substrate which comprises putting ink on the elevated portion of the image side of the flexographic printing plate as described herein, and bringing the ink-containing flexographic printing plate into contact with the substrate, thereby transferring ink from the flexographic printing plate to the substrate and removal of the flexographic printing plate from the substrate.

The invention will now be described in more detail with reference to the Examples.

EXAMPLES

Example 1 (comparative)

A photo-curable polymer composition was prepared by mixing 100 parts of KRATON® D1107 block copolymer with 12 parts by weight of 1,6-hexanediol diacrylate (HDODA), 0.5 parts by weight of antioxidant IRGANOX 1010 (tetrakis-ethylene-(3,5-di-tertiary-butyl-4-hydroxy-hydrocinnamate)methane), and 1.5 parts by weight of photo-initiator IRGACURE 651 (2,2-dimethoxy-1,2-diphenylethan-1-one) in a 25% toluene solution KRATON® D1107 polymer is a mixture of coupled poly(styrene)-poly (isoprene)-poly(styrene) triblock copolymer and uncoupled poly(styrene)-poly(isoprene) di block copolymer. A halide-containing coupling agent (dibromoethane) was used. The coupling efficiency was 83% by weight. Accordingly, the diblock copolymer content was 17% by weight. The total polystyrene content was 15% by weight.

The solution was poured on a plate, and the solvent evaporated at room temperature. Subsequently, the composition was heated to 140° C. and kept at that temperature for 5 minutes, followed by 5 minutes at 140° C., whiles applying 1 MPa pressure in a Schwabenthan press. The photocurable plate thus obtained was about 2 mm thick. The plate was kept in the dark, since the presence of HDODA makes the plates sensitive to curing in daylight, and since in this case no daylight protective layers had been applied.

The plate was cures with a 308 W/inch (300 W/2.5 cm) UV mercury medium pressure lamp from American UV Company. Samples were passed three times under the lamp at a speed of 10 m/min.

The following taste were carried out.
Haze

Haze was measured according to ASTM D1003 on a Colorquest IT apparatus on uncured samples without support.

Results are given in Table 1.

Example 2 (comparative)

A photo curable composition was prepared as in Example 1 but a block copolymer composition A was used. Block copolymer composition A was a mixture of 83% by weight of a poly styrene)-poly(isoprene)-poly(styrene) triblock copolymer and 17% by weight of a poly(styrene)-poly (isoprene) diblock copolymer. The triblock copolymer does not contain a coupling agent. The total polystyrene content was 15% by weight and the total apparent molecular weight of the triblock copolymer was 210,000. The total weight average molecular weight was 144,000. The weight average molecular weight of the diblock copolymer was 72,000. Block copolymer composition A was prepared by re-initiation according to the procedure disclosed in European patent specification No. 0691991.

For this photo-curable composition also the hardness and gel content were determined using the following procedures.
Hardness Shore A hardness was determined after 24s penetration of the needle in the sample and in accordance with ASTM D 2240.
Gel content The gel content is a measure for the degree of arose-linking after curing. To measure the gel content, a known amount of the cured plate is soaked in toluene for one night. The not dissolved mass is dried at 70° C. under vacuum until no further weight loss occurs. The gel content is calculated via: gal content (%)=$w_{(dried)}/w_{(initial)}*100$ with $w_{(initial)}$ being the weight of the cured plate prior to dissolving in toluene, and $w_{(dried)}$ being the weight of the cured plate after dissolving in toluene and drying.

Further, haze was also measured on cured and developed 2 mm think flexographic printing plate samples, without support.

Results are given in Table 1.

Example 3 (comparative)

A photo-curable composition was prepared as in Example 1 but a block copolymer composition B was used. Block copolymer composition B is a mixture of 44% by weight of a poly(styrene)-poly(isoprene)-poly(styrene) triblock copolymer and 56% by weight, a poly (styrene)-poly-(isoprene) diblock copolymer. The triblock copolymer does not contain a coupling agent. The total polystyrene content was 16% by weight and the total weight average molecular weight of the triblock copolymer was 160,000. The weight average molecular weight of the diblock copolymer was about 80,000. Block copolymer composition B was prepared re-initiation according to the procedure disclosed European patent specification No. 0691991.

Example 4

A photo-curable composition was prepared as in Example 3 but in the formulation, 10% by weight of block copolymer composition B was replaced by a low molecular weight styrene-isoprene block copolymer having a polystyrene content of 13% by weight and a weight average molecular weight of 30,000.

Example 5

A photo-curable composition was prepared as in Example 3 but in the formulation, 20 by weight of block copolymer composition B was replaced by a low molecular weight styrene-isoprene block copolymer having a polystyrene content of 13% by weight and a weight average molecular weight of 30,000.

Examples 6–8

Example 5 was repeated, but with 30, 40 and 50% by weight respectively of the block copolymer composition being replaced with the low molecular weight styrene-isoprene block copolymer.

TABLE 1

|  | Example No.: | | | | | | | |
|---|---|---|---|---|---|---|---|---|
|  | 1 | 2 | 3 | 4 | 5 | 6 | 7 | 8 |
| Haze (%) | | | | | | | | |
| No support | 72 | 34 (41) | 40 | | | | | |
| developed plate | | 24 | 33 | 24 | 24 | 43 | 30 | 36 |
| Hardness (Sh A) | | | | | | | | |
| UV9, 24s | | 49 | 49 | | | | | |
| developed plate | | 51 | 49 | 38 | 30 | [24] | 17 | 20 |
| Gel content (%) | | | | | | | | |
| (Uv9) | | 98 | 97 | 95 | 92 | 89 | 86 | 83 |

UV9 = cured by 9 passes under UV lamp
(Sh A) = Shore A Hardness
[24] = reliability of data uncertain
(41) = duplicate Comparative Example 1, as compared to the other Examples, demonstrates that a block copolymer composition containing a residue of a dibromoethane coupling agent is much more hazy. Introducing low molecular weight block copolymer into the block copolymer composition does not significantly affect the amount of haze.

Comparative Examples 2 and 3 demonstrate that an increase in high molecular weight diblock copolymer in the block copolymer composition does not significantly reduce the hardness. Introducing low molecular weight block copolymer into the block copolymer composition does advantageously reduce the hardness.

Example 9

A block copolymer composition c was prepared by blending 79% by weight of block copolymer composition A of Example 2 with 21% by weight of a low molecular weight styrene isoprene block copolymer having a polystyrene content of 13% by weight and a weight average molecular weight of 30,000.

Block copolymer composition C was tested in a flexographic printing plate composition suitable for water development. The developability with water was rated as very good.

The abrasion resistance of this flexographic printing plate was significantly better than a KRATON® D1112 polymer-containing flexographic printing plate composition. KRATON® D1112 polymer is comparable to KRATON D1107 polymer of Example 1, but containing 40% by weight of uncoupled diblock copolymer.

Example 10

A block copolymer composition D was prepared by blending 81% by weight of a full sequential styrene-isoprene-styrene triblock copolymer having a polystyrene content of 19% by weight and a weight average molecular weight of about 116,000 with 19% by weight of a low molecular weight styrene-isoprene block copolymer having a polystyrene content of 13% by weight and a weight average molecular weight of 30,000.

Black copolymer composition D was tested in a flexographic printing plate composition suitable for water development. The developability of the printing plate with water was rated as fair.

Examples 11 and 12

Example 10 was repeated, but using 23% by weight and 26% by weight respectively of the low molecular weight styrene-isoprene block copolymer. The block copolymer compositions were tested in a flexographic printing plate composition suitable for water development. For both block copolymer compositions, the developability of the flexographic printing plate with water was rated as very good.

We claim:

1. A photo-curable polymer composition comprising:
   (a) a first block copolymer comprising at least two external blocks A of a polymerised mono-vinyl aromatic monomer, at least one internal block B of a polymerised conjugated diene monomer, and, optionally, a residue derived from a di- or multi-functional coupling agent containing alkoxy or epoxy functional groups, wherein the total polymerised mono-vinyl aromatic monomer content in from 5 to 25% by weight of the block copolymer;
   (b) 5 to 70% by weight of a second block copolymer having one block A of a polymerised mono-vinyl aromatic monomer, at least one block B of a polymerised conjugated diene monomer, and, optionally, a residue derived from a di- or multi-functional coupling agent containing alkoxy or epoxy functional groups, wherein the total polymerised mono-vinyl aromatic monomer content is from 5 to 50% by weight of the block copolymer;
   (c) at least 5% by weight of a low molecular weight block copolymer, wherein the total of (b) and (c) is from 15% by weight to 80% by weight of the total of (a), (b), and (c), the low molecular weight block copolymer having one block A of a polymerised mono-vinyl aromatic monomer, and at least one block B of a polymerised conjugated diene monomer, and having a weight average molecular weight from about 1,000 to about 35,000; and
   (d) a photo-initiator.

2. A photo-curable polymer composition as claimed in claim 1 further comprising an ethylenically unsaturated addition-polymerisable cross-linking agent.

3. A photo-curable polymer composition as claimed in claim 1, wherein the first block copolymer has the structure A-B-A, and has a total weight average molecular weight in the range of from 58,000 to 300,000.

4. A photo-curable polymer composition as claimed in claim 1, wherein the second block copolymer has the structure A-B and has a total weight average molecular weight in the range of from 35,000 to 150,000.

5. A photo-curable polymer composition as claimed in claim 4, wherein the first block copolymer has a total weight average molecular weight in the range of from 65,000 to 250,000 and the second block copolymer has a total weight average molecular weight in the range of 40,000 to 150,000.

6. A photo-curable polymer composition as claimed in claim 1, wherein the total of (b) and (c) is from 20% to 80% by weight.

7. A photo-curable polymer composition as claimed in claim 1, comprising 0.01 to 5% by weight of photo-initiator.

8. A flexographic printing plate precursor comprising a photo-curable layer sandwiched between two release films or a release film and a support, wherein the release film(s) and any support substantially prevent actinic radiation from reaching the photo-curable layer, and wherein the photo-curable layer contains the photo-curable polymer composition as claimed in claim 1.

9. The flexographic printing plate precursor of claim 8, wherein the second block copolymer of the photo-curable polymer composition has me structure A-B and has a total weight average molecular weight in the range of from 35,000 to 150,000.

10. A cured polymer composition, obtainable by curing a photo-curable composition as claimed in claim 1 with actinic radiation.

11. The cured polymer composition of claim 10, wherein the second block copolymer of the photo-curable polymer composition has the structure A-B and has a total weight average molecular weight in the range of from 35,000 to 150,000.

12. A flexographic printing plate containing the cured polymer composition of claim 10.

13. A photo-curable polymer composition, comprising:
   (a) a first block copolymer comprising at least two external blocks A of a polymerised mono-vinyl aromatic monomer and at least one internal block B of a polymerised conjugated diene monomer, wherein the total polymerised mono-vinyl aromatic monomer content comprises 5% to 25% by weight of the first block copolymer
   (b) a second block copolymer having one block A of a polymerised mono-vinyl aromatic monomer, at least one block B of a polymerised conjugated diene monomer, wherein the total polymerised mono-vinyl aromatic monomer content comprises 5% to 50% by weight of the second block copolymer, wherein the second block copolymer comprises from 5% to 70% by weight of polymer components in the photo-curable polymer composition;
   (c) at least 5% by weight of a low molecular weight block copolymer having one block A of a polymerised mono-vinyl aromatic monomer and at least one block B of a polymerised conjugated diene monomer, wherein the low molecular weight block copolymer has a weight average molecular weight of about 1,000 to about 35,000; and
   (d) a photo-initiator.

14. The photo-curable polymer composition of claim 13, wherein the second block copolymer and the low molecular weight block copolymer comprise 15 to 80% by weight of the polymer components in the photo-curable polymer composition.

15. A photo-curable polymer composition, consisting essentially of:

(a) a first block copolymer comprising at least two external blocks A of a polymerised mono-vinyl aromatic monomer and at least one internal block B of a polymerised conjugated diene monomer, wherein the total polymerised mono-vinyl aromatic monomer content comprises 5% to 25% by weight of the first block copolymer;

(b) a second block copolymer having one block A of a polymer mono-vinyl aromatic monomer, at least one block B of a polymerised conjugated diene monomer, wherein the total polymerised mono-vinyl aromatic monomer content comprises 5% to 50% by weight of the second block copolymer, wherein the second block copolymer comprises from 5% to 70% by weight of polymer components in the photo-curable polymer composition;

(c) at least 5% by weight of a low molecular weight block copolymer having one block A of a polymerised mono-vinyl aromatic monomer and at least one block B of a polymerised conjugated diene monomer, wherein the low molecular weight block copolymer has a weight average molecular weight of about 1,000 to 35,000; and (d) a photo-initiator.

* * * * *